AUTOMATIC SHIFT DRIVE FOR A MULTIBAND TUNER

Filed May 15, 1967

INVENTOR
LUDWIG J. FICHTER

BY Hofgren, Wegner, Allen, Stellman & McCord

ATTORNEYS.

United States Patent Office 3,415,130
Patented Dec. 10, 1968

3,415,130
AUTOMATIC SHIFT DRIVE FOR A MULTIBAND TUNER

Ludwig J. Fichter, Crystal Lake, Ill., assignor to Oak Electro/Netics Corp., a corporation of Delaware
Filed May 15, 1967, Ser. No. 638,292
9 Claims. (Cl. 74—10.45)

ABSTRACT OF THE DISCLOSURE

A tuning mechanism for two high frequency tuners, includes a pair of rotatable control shafts in concentric relation. A drive gear is mounted on one of the shafts and tuning gears on opposite sides of the drive gear are concentric with the control shafts for independent rotation to operate the tuners. An idler gear is in driving engagement with said drive gear for rotation independently of said tuning gears. A cam responsive to rotation of the other of the control shafts selectively shifts the idler gear from engagement with one of the tuning gears to the other in one angular position of said other control shaft.

*Background of the invention*

This invention relates to a tuning mechanism for a television receiver having separate UHF and VHF units. The tuning mechanism provides automatic changeover from VHF tuning to UHF tuning as a result of rotation of the channel selector shaft to the UHF position. The patent to Sperber 2,788,668 illustrates one such tuning mechanism. A pair of disc shaped drive members are axially spaced in the receiver chassis and have opposed surfaces with teeth thereon, one of the drive members being a VHF fine tuning drive and the other UHF course and fine tuning drive. A pair of manually operated control shafts are disposed in concentric relation with one of the shafts journalled for axial movement in the receiver chassis to move a clutch member in opposite directions to establish a driving relation with the opposed UHF and VHF drive members. The clutch has teeth on its opposite faces which mesh with the toothed faces of the UHF and VHF drive members. In such constructions, the teeth on the opposed faces of the clutch member and drive members are relatively pointed or triangularly shaped so that the teeth mesh as the clutch member is moved axially for engagement with the toothed drive members. When the clutch member is meshed with one of the fine tuning drive members, and rotary force is applied thereto, the tapered faces of the gear teeth exert axial forces between the clutch and drive members tending to separate the members from their meshed relationship. Thus, an undesirably heavy spring is required to keep the members in their meshed relationship. Such heavy springs cause undue stresses on the receiver chassis and the individual tuning elements.

In addition, when the channel selector shaft is rotated to its UHF position, a spring urged cam member shifts the clutch member from meshed engagement with the VHF drive member to engagement with the UHF drive member, thereby adding an additional spring force to the mechanism. These unduly large spring forces not only create stresses within the tuning mechanism, but the teeth between the clutch member and the drive members sometimes have a tendency to bind or hang up during shifting of the clutch member.

The teeth on the clutch and drive members should not be too pointed or they would tend to wear rapidly. However, flat teeth tend to abut each other rather than meshing between each other, and to free the teeth the abovementioned large spring forces must be overcome and the clutch member manipulated to position the teeth in their proper meshed relationship, causing further stresses on the tuner mechanism.

This invention is concerned with a tuning mechanism which eliminates these problems.

*Summary of the invention*

An object of this invention is to provide a new and improved tuning mechanism for two tuners.

Another object of this invention is to provide a tuning mechanism for a television receiver having separate UHF and VHF tuning units, with an improved means for shifting from one tuning member to the other.

A further object is to provide a tuning mechanism having a pair of concentric rotatable control shafts one of which rotates a drive gear, a UHF and VHF tuning gear on opposite sides of the drive gear, and an idler gear in driving engagement with the drive gear for selective engagement with one of the tuning gears, the idler gear being shiftable between the tuning gears in one angular position of the other control shaft.

*Detailed description of the invention*

Figures 1, 2, 3, 4, 5:
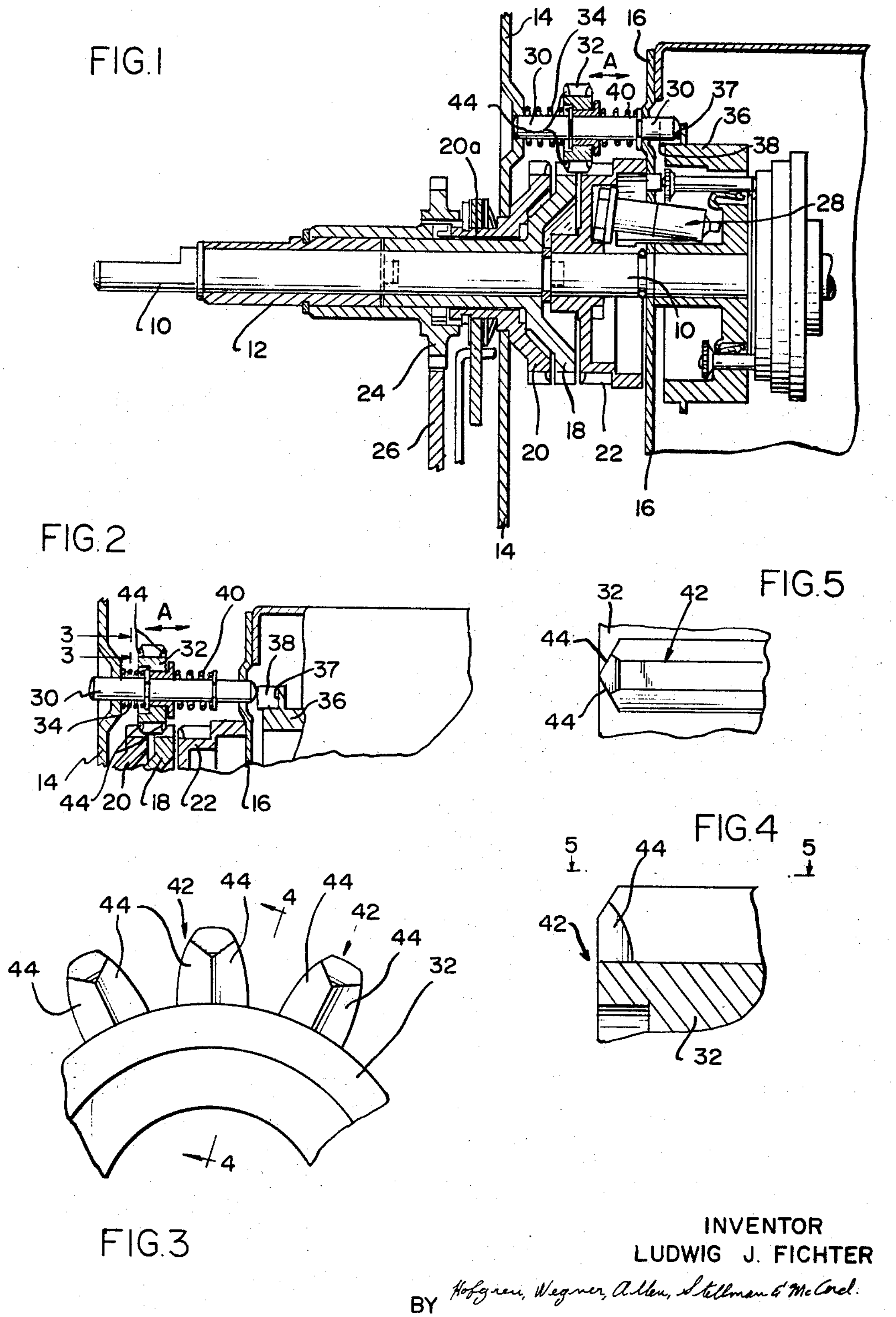
FIG. 1 is a side sectional view, partly broken away, of a tuning mechanism embodying the invention, and positioned for VHF tuning control.
FIG. 2 is a partial sectional view similar to FIG. 1, with said mechanism positioned for UHF tuning control.
FIG. 3 is a partial front elevation view of the idler gear of this invention.
FIG. 4 is a partial sectional view taken generally along the line 4—4 of FIG. 3.
FIG. 5 is a plan view taken generally in the direction of line 5—5 in FIG. 4.

As applied to television receivers, the tuning control mechanism of the present invention is provided with a pair of manually operated control shafts 10 and 12 preferably arranged in concentric relation to each other and journalled in a front panel 14 and front wall 16 of the tuner chassis. Shaft 10 is a channel selector shaft and may have 12 VHF positions (for instance channels 2–13) and one UHF position, spaced over 360° rotation of the shaft. As will be more fully described below, when channel selector shaft 10 is in any of the VHF positions, the control mechanism of this invention couples a drive gear 18 on fine tuner shaft 12 to the VHF fine tuning control means. When shaft 10 is in the UHF position, the control mechanism automatically couples the drive gear 18 to the UHF tuning control means.

Channel selector shaft 10 is continuously rotatable in either direction for ease in channel selection and may be rotated to change from VHF tuning to UHF tuning without disturbing the previous setting of the VHF fine tuner, and vice versa.

Control shaft 12 is both the UHF course and fine tuning shaft and the VHF fine tuning shaft and comprises a sleeve surrounding and concentric with the channel selector shaft 10. Drive gear 18 is formed integrally with the inner end of tuning shaft 12 for rotation therewith independent of channel selector shaft 10.

First and second fine tuning gears 20 and 22, respectively, are mounted on opposite sides of drive gear 18 concentric with control shafts 10, 12 for rotation independent of each other and independent of the control shafts. Fine tuning gear 20 is connected with a UHF tuning mechanism and is rotatably journalled by means of a sleeve portion 20*a* about tuning shaft 12 to the left of drive gear 18 in FIG. 1. The sleeve portion 20*a* of tuning gear 20 is connected to an indicator gear 24 which, through gear 26, operates the UHF tuning mechanism of the receiver as well as indicates the UHF channel. Tuning gear 22 is connected with a VHF fine tuning mechanism and is rotatably journalled about channel selector shaft 10 to the right of drive gear 18 in FIG. 1. The VHF fine tuning gear 22 operates through a memory tuning mechanism, generally designated 28, to tune the VHF oscillator circuits.

The tuning control mechanism of this invention includes a third shaft or shift pin 30 rotatably journalled at opposite ends in the front panel 14 and chassis front wall 16, parallel to the control shafts 10, 12. The shift pin is journalled for axial movement in the direction of arrow A (FIG. 1) and carries an idler shift gear 32 which is rotatably mounted on and which is spring biased on the shift pin 30 for axial movement therewith. The shift pin 30 and idler gear 32 are positioned for engagement with drive gear 18 and the UHF or VHF tuning gear 20 and 22, respectively. The drive gear and fine tuning gears have substantially equal diameters and only axial movement of idler shift gear 32 in the direction of arrow A is necessary for the idler gear to mesh with drive gear 18 and one of the tuning gears 20, 22.

A compression coil spring 34 surrounds the left portion (FIGS. 1 and 2) of shift pin 30 between the front panel 14 and the left face of idler gear 32. Spring 34 biases the idler gear 32 to a position (FIG. 1) where the idler gear meshes with the VHF tuning gear 22. In this position, rotation of tuning shaft 12, through drive gear 18 and shift gear 32, rotates VHF tuning gear 22 to operate the VHF tuner mechanism 28.

In order to shift the idler gear 32 to the left in FIG. 1 toward a position as shown in FIG. 2, where the shift gear 32 establishes driving engagement between drive gear 18 and UHF tuning gear 20, a rotary cam plate 36 is fixed to channel selector shaft 10 for rotation therewith. In the twelve angular positions of the channel selector shaft 10, corresponding to the VHF television channels 2–13, the inner end of shift pin 30 engages an annular cam surface 37 as spring 34 maintains idler gear 32 meshed with drive gear 18 and VHF tuning gear 22, establishing driving engagement therebetween. In the thirteenth angular position of channel selector shaft 10, a shift cam member 38 (FIG. 2) urges shift pin 30 against compression spring 34 shifting idler gear 32 to the left in the drawings to a position (FIG. 2) where the shift gear 32 meshes with drive gear 18 and UHF tuning gear 20, establishing driving engagement therebetween so that rotation of tuning shaft 12 operates the UHF tuning mechanism of the receiver.

A spacer spring 40, similar to compression spring 34, is positioned between the inner face of idler gear 32 and the chassis front wall 16 to act as a cushion-type stop means to define the limit of travel and therefore the position of the idler shift gear 32 when it is shifted back to its VHF tuning position. The spacer spring 40 will compress and thus permit full axial movement of shift pin 30 even if gears 18 and 20 happen to be angularly positioned so that idler gear 32 cannot freely slide into engagement with gear 20. It is, therefore, not possible to jam or damage the mechanism. Spring 34 acts similarly as far as gears 18 and 22 are concerned.

It can be seen that the UHF and VHF tuning gears 20 and 22, respectively, are not distributed from their previous setting by shifting of the idler shift gear 32. Since shift gear 32 is a "free" or idler gear, there is very little tendency for the gears to bind or hang up. In addition, FIGS. 3 through 5 show that the gear teeth of the gears 18, 20, 22 and 32 are quite blunt for long life. As referred to above, heretofore the outer surfaces of such blunt gear teeth of one control member oftentimes abutted the outer surfaces of the teeth of the adjacent control member, and further manipulation had to be effected to unblock the members. With the structure of this invention, the idler gear 32 is in constant mesh with drive gear 18 and, being a "free" gear, easily aligns itself with the fine tuning gears 20, 22. Referring to FIGS. 3 through 5, to enhance the aligning capabilities of the idler gear 32, the ends of the gear teeth, generally designated 42, are bevelled to form inclined camming surfaces 44 which engage like bevelled surfaces on the ends of the gear teeth of each of the fine tuning gears 20, 22 nearest the drive gear 18 to guide the teeth toward a meshed relationship.

In addition, the force of the small compression spring 34 is the only force necessary to overcome for the actuating cam element 38 to shift idler gear 32. Not only does the shape of the gear teeth of the idler gear and fine tuning gears, and the "free" nature of the idler gear, prevent binding between the engaged gear teeth, but the small force of spring 34 is too weak to cause binding between the gears. The stresses created on the chassis and other tuning elements of the receiver mechanism are negligible.

I claim:

1. A tuning mechanism for two tuners, comprising: a chassis rotatably mounting a pair of control shafts in concentric relation; a drive gear mounted on one of said shafts for rotation therewith; first and second tuning gears for said tuners, mounted on opposite sides of said drive gear concentric with said control shafts for rotation independent of each other and said control shafts; a third shaft journalled in said chassis adjacent said drive gear and tuning gears and parallel to said control shafts for rotational and axial movement relative thereto; an idler gear fixed to said third shaft for rotational and axial movement therewith, said idler gear being in driving engagement with said drive gear; a spring urging said third shaft axially to bias said idler gear toward one of said tuning gears for driving engagement therewith and a rotary cam fixed to the other of said control shafts for rotation therewith and engageable with said third shaft to shift said idler gear from engagement with said one of the tuning gears to the other in at least one preselected angular positioning of the cam by rotation of said other control shaft.

2. The tuning mechanism of claim 1 wherein said drive gear and said tuning gears have substantially equal diameters.

3. A tuning mechanism for two tuners, comprising: a chassis rotatably mounting a pair of control shafts; a drive gear mounted on one of said control shafts for rotation therewith; first and second tuning gears, one for each of said tuning gears; and means responsive to rotation of the axis, said tuning gears lying in different planes, parallel with and axially spaced from the plane of the drive gear; an idler gear in driving engagement with said drive gear and movable axially for selective engagement with one of said tuning gears; and menas responsive to rotation of the other of said control shafts to shift said idler gear from engagement with said one of the tuning gears to the other in at least one angular position of said other control shaft.

4. The tuning mechanism of claim 3 wherein said first and second tuning gears are mounted on opposite sides of said drive gear with their axes of rotation coincident with the axis of said one shaft.

5. The tuning mechanism of claim 5 wherein said drive gear and said tuning gears have substantially equal diameters, said idler gear means comprising a pinion gear shiftable along an axis parallel to the axis of said tuning gears and control shafts.

6. The tuning mechanism of claim 5 wherein said idler is fixed to a third shaft rotatably journalled in said chassis parallel to said control shafts, said third shaft being movable axially of said control shafts to shift said idler gear.

7. The tuning mechanism of claim 6 wherein said shifting means includes a rotary cam means fixed to the other of said control shafts for rotation therewith and engageable with one end of said third shaft to move said third shaft axially to shift said idler gear.

8. The tuning mechanism of claim 7 including spring means urging said third shaft axially against said cam means to bias said idler gear toward one of said tuning gears.

9. The tuning mechanism of claim 8 wherein said spring means comprises a coil spring surrounding said third shaft between said idler gear and said chassis to urge said third shaft against said cam means.

References Cited

UNITED STATES PATENTS 2,756,599 7/1956 Sperber ------------- 74—10.5

MILTON KAUFMAN, *Primary Examiner.*

U.S. Cl. X.R.

74—10.8, 337.5